United States Patent
Blanc

(10) Patent No.: US 8,368,461 B2
(45) Date of Patent: Feb. 5, 2013

(54) SECOND-ORDER LOW-PASS FILTER

(75) Inventor: Jean-Pierre Blanc, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/070,285

(22) Filed: Mar. 23, 2011

(65) Prior Publication Data

US 2011/0234310 A1 Sep. 29, 2011

(30) Foreign Application Priority Data

Mar. 26, 2010 (FR) .................................. 10 52229

(51) Int. Cl.
*H03K 5/00* (2006.01)

(52) U.S. Cl. ........................................ 327/558; 327/552

(58) Field of Classification Search .......... 327/551–559, 327/336–337

See application file for complete search history.

(56) References Cited

U.S. PATENT DOCUMENTS

| | | | | |
|---|---|---|---|---|
| 3,605,032 A | * | 9/1971 | Kerwin | 330/107 |
| 4,127,750 A | * | 11/1978 | Prudhon et al. | 370/282 |
| 6,060,935 A | * | 5/2000 | Shulman | 327/345 |
| 6,304,128 B1 | * | 10/2001 | Shulman | 327/345 |
| 6,344,773 B1 | * | 2/2002 | Sevastopoulos et al. | 327/558 |
| 7,471,140 B2 | * | 12/2008 | Salerno | 327/551 |
| 2004/0155702 A1 | | 8/2004 | Danielsson | |

FOREIGN PATENT DOCUMENTS

| | | |
|---|---|---|
| EP | 0 274 784 A1 | 7/1988 |
| EP | 1 764 949 A1 | 3/2007 |

OTHER PUBLICATIONS

Republique Francaise Institut National De La Propriete Industrielle, Rapport de Recherche Preliminaire (Preliminary Search Report); issued in French Patent Application No. 10-52229 on Nov. 30, 2010 (2 pages).

Aronhime, et al., "Conversion of Voltage-mode Biquads to Current-mode," Circuits and Systems, 1995,, Proceedings of the 38th Mid-West Symposium on Rio de Janeiro, Brazil, Aug. 13-16, 1995, New York, NY, USA, IEEE, vol. 2, 13, 1995 (pp. 1054-1057).

Cano, "Eliminate Sallen-Key Stopband Leakage With a Voltage Follower," Electronics Design Strategy News, Jan. 6, 2009, available online at URL <http://www.edn-europe.com> (10 pages).

* cited by examiner

*Primary Examiner* — Dinh T. Le
(74) *Attorney, Agent, or Firm* — Gardere Wynne Sewell LLP

(57) ABSTRACT

A low-pass filter, including: between a first terminal and a second terminal, a series association of a first resistor, of a second resistor, and of a first amplifier; in parallel with the second resistor, a series association of a second amplifier and of a first capacitor; a second capacitor between an input of the first amplifier and a third terminal of application of a reference voltage; and a third capacitor between the second terminal and the third terminal.

21 Claims, 1 Drawing Sheet

SECOND-ORDER LOW-PASS FILTER

This application claims the priority benefit of French patent application Ser. No. 10/52229, filed Mar. 26, 2010, entitled "Second-Order Low-Pass Filter," which is hereby incorporated by reference to the maximum extent allowable by law.

TECHNICAL FIELD

The present invention relates to a low-pass filter. More specifically, the present invention relates to a low-pass filter of second order.

BACKGROUND

High-order low-pass or high-pass filters are generally formed of a series association of several second-order filters. Indeed, it is easier to make several second-order filters than a single filter of higher order.

To obtain second-order filters, many structures are known. An example of such filter structures is known as a "Sallen-Key filter." Sallen-Key filters are voltage-controlled voltage sources (VCVS). Low-pass or high-pass filters are obtained by modification of the impedances forming these filters.

FIG. 1 illustrates a second-order low-pass filter 10 of the Sallen-Key type. Filter 10 comprises an input terminal IN receiving an input voltage $V_{in}$ and an output terminal OUT providing an output voltage $V_{out}$. A first resistor $R_1$, a second resistor $R_2$, and a voltage amplifier 12 of unity gain (commonly and hereinafter called "buffer") are series-connected between terminal IN and terminal OUT. Resistors $R_1$ and $R_2$ have a same value R. A capacitor $C_1$ is placed between the output terminal OUT and the connection node between the first resistor $R_1$ and the second resistor $R_2$ and a capacitor $C_2$ is placed between the input terminal of buffer 12 and a ground terminal.

An ideal circuit such as described hereabove has a second-order transfer function T, of the following type:

$$T = \frac{Vout}{Vin} = \frac{1}{1 + \frac{1}{Q}\left(\frac{j\omega}{\omega_0}\right) + \left(\frac{j\omega}{\omega_0}\right)^2}$$

with $f_0 = \frac{\omega_0}{2\pi} = \frac{1}{2\pi R\sqrt{C_1 \cdot C_2}}$ and $Q = \frac{1}{2}\sqrt{\frac{C_1}{C_2}}$ Buffer 12 may be obtained in several ways. It may in particular be formed of an operational amplifier of unity gain or of an emitter follower circuit (in bipolar technology) or of a source follower circuit (in CMOS technology). However, whatever the structure of the circuit of buffer 12, it has a non-zero output impedance (shown in FIG. 1 as a resistor $R_0$, in dotted lines, in series between the output of buffer 12 and capacitor $C_1$). Only buffers having a resistive output impedance will be considered herein.

In the case where buffer 12 has a resistive output impedance of non-zero value $R_0$, the transfer function of the circuit of FIG. 1 becomes:

$$T = \frac{1 + j\omega(R_0 \cdot C_1) + (j\omega)^2(R \cdot R_0 \cdot C_1 \cdot C_2)}{1 + j\omega(2R \cdot C_2 + R_0 C_1) + (j\omega)^2(R^2 C_1 \cdot C_2 + 2R \cdot R_0 \cdot C_1 \cdot C_2)}$$

This transfer function is no longer of second order. Further, it has the disadvantage, for high frequencies, of tending towards a fixed value equal to $R_0/(R+2R_0)$. Thus, high-frequency signals are not sufficiently attenuated.

It has already been provided to modify the circuit of buffer 12 by adding elements for decreasing the output impedance of the device. However, this output impedance decrease can only be achieved by complicating the structure of the buffer circuit, and thus by increasing its cost and its consumed power.

A paper entitled "Eliminate Sallen-Key stopband leakage with a voltage follower", by Martin Cano—National Semiconductor, EDN, published in May 2009, teaches modifying the structure of the Sallen-Key filter to decrease the influence of the output resistance. FIG. 2 shows an example of a filter 16 discussed in this paper.

Filter 16, shown in FIG. 2, comprises all the elements of circuit 10 of FIG. 1, the resistive output impedance of buffer 12 being called $R_0$. It further comprises, between output terminal OUT and capacitor $C_1$, a second buffer 14 having a resistive output impedance, also of value $R_0$. This circuit has the following transfer function:

$$T = \frac{1 + j\omega(R_0 \cdot C_1)}{1 + j\omega(2R \cdot C_2 + R_0 C_1) + (j\omega)^2(R^2 C_1 \cdot C_2 + 2R \cdot R_0 \cdot C_1 \cdot C_2)}$$

Filter 16 has the advantage of cutting off high frequencies and of having a frequency response which does not tend towards a finite value. Indeed, when the frequency increases, the transfer function tends towards zero. However, due to the presence of a zero in the transfer function, this circuit does not have a second-order frequency response curve.

There is a need for a second-order low-pass filter having an improved frequency response, close to the theoretical transfer function.

SUMMARY OF THE INVENTION

In accordance with an embodiment of the present invention, a low-pass filter comprises, between a first terminal and a second terminal, a series association of a first resistor, a second resistor, and a first amplifier. In parallel with the second resistor, a series association of a second amplifier and a first capacitor is located. A second capacitor is located between an input of the first amplifier and a third terminal of application of a reference voltage. A third capacitor is located between the second terminal and the third terminal.

In accordance with another embodiment of the present invention, a low-pass filter comprises a first resistor, a second resistor, and a first buffer connected in series between a first terminal and a second terminal. A second buffer and a first capacitor are connected in parallel with the second resistor, the second buffer and the first capacitor connected in series relative to each other. A second capacitor is connected between an output of the first buffer and a reference voltage, and a third capacitor is connected between an input to the first buffer and the reference voltage.

In accordance with yet another embodiment of the present invention, a low-pass filter comprises an input terminal and an output terminal. A first resistor, a second resistor, and a first buffer are connected in series between the input terminal and the output terminal, wherein the first buffer is connected to the output terminal through a first node, the second resistor is connected to the first resistor through a second node, and the second resistor is connected to the first buffer through a third node. A first capacitor is connected between the first node and reference voltage, and a second capacitor is connected between the third node and the reference voltage. A second buffer and a third capacitor are connected in series between the third node and the second node.

The foregoing and other objects, features, and advantages of the present invention will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings.

DETAILED DESCRIPTION OF ILLUSTRATIVE EMBODIMENTS

Figure 1:
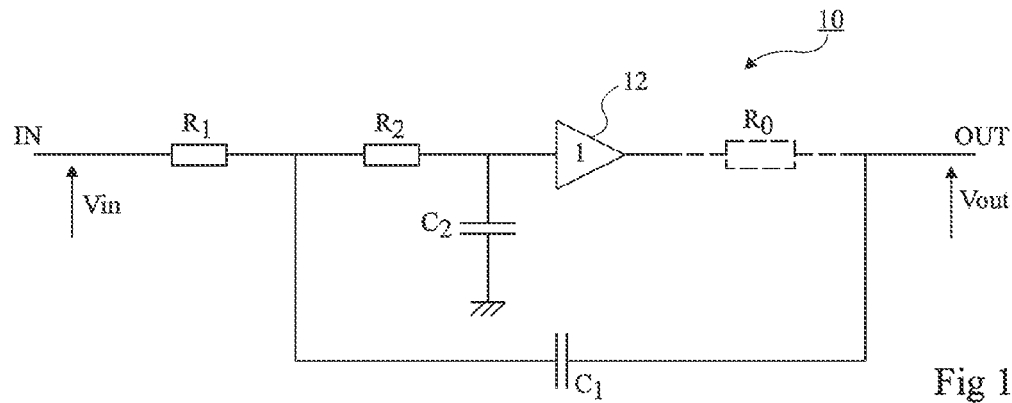
FIG. 1, previously described, shows a second-order low-pass filter of Sallen-Key type.
Figure 2:
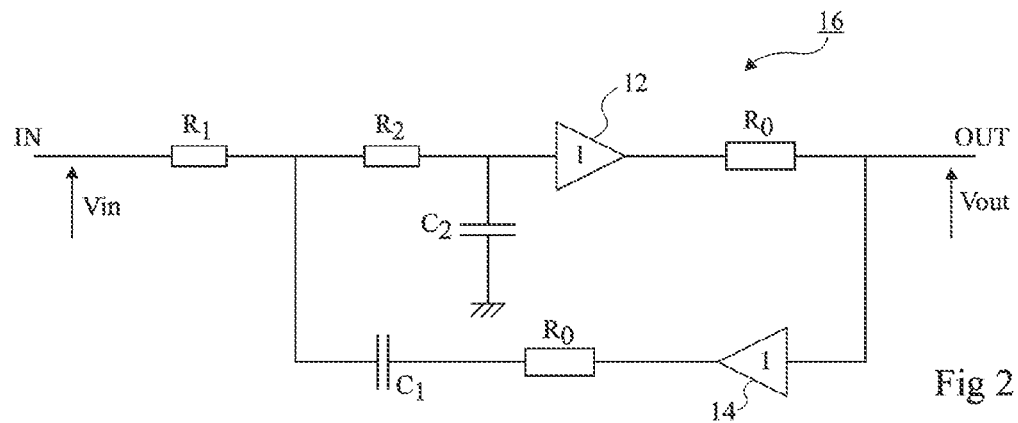
FIG. 2, previously described, shows a known circuit corresponding to an improvement of the filter of FIG. 1.

An object of an embodiment of the present invention is to provide a low-pass filter overcoming all or part of the above-mentioned disadvantages.

Another object of an embodiment of the present invention is to provide a second-order low-pass filter having a real transfer function close to a theoretical transfer function.

Thus, an embodiment of the present invention provides a low-pass filter, comprising: between a first terminal and a second terminal, a series association of a first resistor, of a second resistor, and of a first amplifier; in parallel with the second resistor, a series association of a second amplifier and of a first capacitor; a second capacitor between an input of the first amplifier and a third terminal of application of a reference voltage; and a third capacitor between the second terminal and the third terminal.

According to an embodiment of the present invention, the first and the second amplifiers have a unity gain.

According to an embodiment of the present invention, the ratio between the capacitances of the first capacitor and of the third capacitor is equal to the ratio between the output resistance of the first amplifier and the output resistance of the second amplifier.

According to an embodiment of the present invention, the first and second resistances have identical values.

According to an embodiment of the present invention, the first and third capacitors have equal capacitances.

According to an embodiment of the present invention, the first and second capacitors have capacitances respectively equal to:

$$\frac{1}{2\pi \cdot R \cdot f_0}\sqrt{2\frac{B - A \pm \sqrt{B^2 - 2AB}}{A^2(1 + 2A)}}$$

$$\frac{1}{2\pi \cdot R \cdot f_0}\sqrt{\frac{1}{2(1 + 2A)}\frac{A^2}{B - A \pm \sqrt{B^2 - 2AB}}}$$

with: $A = \frac{R_0}{R}$ and $B = \frac{1 + 2R_0/R}{4Q^2}$ with $R_0$ standing for the value of the output resistance of each of the first and second amplifiers, R designating the value of the first and second resistances, Q and $f_0$ respectively designating the quality factor and the natural frequency of the low-pass filter.

According to an embodiment of the present invention, the values of the output resistances of the first and second amplifiers comply with the following inequality:

$$R_0 \leq R\left(\frac{1}{8Q^2 - 2}\right)$$

According to an embodiment of the present invention, the first and second capacitors have capacitances respectively equal to:

$$\frac{1}{2\pi \cdot R \cdot f_0}\sqrt{2\frac{B - A \pm \sqrt{B^2 - 2AB}}{A^2(1 + 2A)}}$$

$$\frac{1}{2\pi \cdot R \cdot f_0}\sqrt{\frac{1}{2(1 + 2A)}\frac{A^2}{B - A \pm \sqrt{B^2 - 2AB}}}$$

with: $A = \frac{R_0}{R}$ and $B = \frac{1 + 2R_0/R}{4Q^2}$ with $R_0$ standing for the value of the output resistance of the second amplifier, R designating the value of the first and second resistances, Q and $f_0$ respectively designating the quality factor and the natural frequency of the low-pass filter.

According to an embodiment of the present invention, the value of the output resistance of the second amplifier complies with the following inequation:

$$R_0 \leq R\left(\frac{1}{8Q^2 - 2}\right)$$

Figure 3:
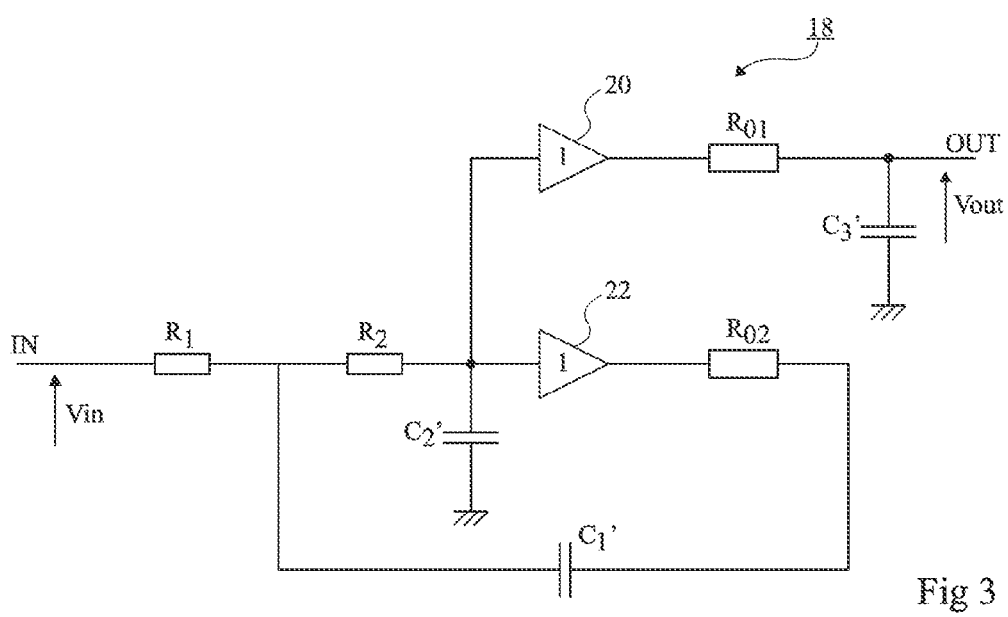
FIG. 3 shows a circuit of a second-order low-pass filter according to an embodiment of the present invention.

FIG. 3 illustrates a low-pass filter 18 having a second-order transfer function according to an embodiment of the present invention. The filter 18 comprises, in series between an input terminal IN of an input voltage $V_{in}$ and an output terminal OUT of an output voltage $V_{out}$, a first resistor $R_1$, a second resistor $R_2$, and a first buffer 20 having a resistive output impedance of value $R_{01}$ (schematically shown between the output of first buffer 20 and output OUT).

A branch comprising, in series, a second buffer 22 having a resistive output impedance of value $R_{02}$ and a first capacitor $C_1'$ is connected in parallel with second resistor $R_2$. A second capacitor $C_2'$ is connected between the input of second buffer 22 and a terminal of application of a reference voltage, for example, ground, and a third capacitor $C_3'$ is provided between output OUT and the terminal of application of the reference voltage (for example, ground).

To obtain a low-pass circuit having a second-order transfer function following a theoretical transfer function, the present inventor has determined conditions to be preferably fulfilled by capacitors $C_1'$, $C_2'$, and $C_3'$, in the case where resistors $R_1$ and $R_2$ are both of value R and where output resistors $R_{01}$ and $R_{02}$ are both of value $R_0$. It should be noted that those skilled in the art will easily determine the output resistance of the first and second buffers according to the elements which form them.

In this case, capacitors $C_1'$, $C_2'$, and $C_3'$ preferentially comply with the following relations:

$$C_1' = \frac{1}{2\pi \cdot R \cdot f_0} \sqrt{2 \frac{B - A \pm \sqrt{B^2 - 2AB}}{A^2(1 + 2A)}}$$

$$C_2' = \frac{1}{2\pi \cdot R \cdot f_0} \sqrt{\frac{1}{2(1 + 2A)} \frac{A^2}{B - A \pm \sqrt{B^2 - 2AB}}}$$

$$C_3' = C_1',$$

with: $A = \frac{R_0}{R}$ and $B = \frac{1 + 2R_0/R}{4Q^2}$ with $f_0$ and $Q$ respectively designating the desired natural frequency and quality factor of the filter, in accordance with the general equation of a second-order low-pass filter:

$$T = \frac{Vout}{Vin} = \frac{1}{1 + \frac{1}{Q}\left(\frac{j\omega}{\omega_0}\right) + \left(\frac{j\omega}{\omega_0}\right)^2}, f_0 = \frac{\omega_0}{2\pi}$$

Further, the above equations imply an additional condition for the circuit to operate properly. Output resistance $R_0$ of the first and second buffers must comply with the following inequation:

$$R_0 \leq R\left(\frac{1}{8Q^2 - 2}\right)$$

Thus, for a given value of the quality factor of the filter, value $R_0$ of the output resistor of the buffer must be smaller than the above value.

A circuit complying with the above requirements follows an ideal second-order transfer function, having, at high frequency, a second-order asymptote (−40 dB/decade).

Further, the present inventor has shown that, if output resistances $R_{01}$ and $R_{02}$ are not equal, for example, if $R_{02}=R_0$ and $R_{01}=R_0/D$, D being a positive number, it is sufficient to modify the value of third capacitance $C_3'$, and to set it to a value $C_3''=D.C_3'=D.C_1'$ for the circuit to operate properly again, that is, as a theoretical second-order low-pass filter.

If a low-pass circuit of higher order than the second order is desired to be obtained, several circuits such as circuit 18 may be used in series.

Specific embodiments of the present invention have been described. Various alterations, modifications, and improvements will occur to those skilled in the art. In particular, a circuit comprising buffers 20 and 22 of equal unity gains has been described herein. It should be noted that buffers 20 and 22 may have different and/or non-unity gains. In this case, it will be within the abilities of those skilled in the art to easily modify the above operations to obtain an ideal second-order low-pass filter. Further, the circuit of FIG. 3 has been described with resistors $R_1$ and $R_2$ of same values. A circuit comprising resistors $R_1$ and $R_2$ of different values may also be provided, by adapting the values of the other elements.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A low-pass filter comprising:
   a first circuit comprising a series connection of a first resistor, a second resistor, and a first amplifier, said first circuit connected between an input terminal and an output terminal;
   a second circuit comprising a series connection of a second amplifier and a first capacitor, said second circuit connected in parallel with the second resistor;
   a second capacitor connected between an input of the first amplifier and a reference terminal of application of a reference voltage; and
   a third capacitor connected between the output terminal and the reference terminal.

2. The filter of claim 1, wherein the first and second amplifiers have a unity gain.

3. The filter of claim 1, wherein a first ratio between capacitances of the first capacitor and of the third capacitor is equal to a second ratio between a resistive output impedance of the first amplifier and the resistive output impedance of the second amplifier.

4. The filter of claim 1, wherein the first and second resistors have identical values.

5. The filter of claim 4, wherein the first and third capacitors have equal capacitances.

6. The filter of claim 5, wherein the first and second capacitors have capacitances respectively equal to:

$$\frac{1}{2\pi \cdot R \cdot f_0} \sqrt{2 \frac{B - A \pm \sqrt{B^2 - 2AB}}{A^2(1 + 2A)}} \; ; \text{and}$$

$$\frac{1}{2\pi \cdot R \cdot f_0} \sqrt{\frac{1}{2(1 + 2A)} \frac{A^2}{B - A \pm \sqrt{B^2 - 2AB}}},$$

with: $A = \frac{R_0}{R}$ and $B = \frac{1 + 2R_0/R}{4Q^2}$, $R_0$ standing for a resistive output impedance of each of the first and second amplifiers, R designating a resistance of the first and second resistors, Q and $f_0$, respectively, designating a quality factor and a natural frequency of the filter.

7. The filter of claim 6, wherein the resistive output impedances of the first and second amplifiers comply with the following inequality:

$$R0 \leq R\left(\frac{1}{8Q^2 - 2}\right).$$

8. The filter of claim 4, wherein the first and second capacitors have capacitances respectively equal to:

$$\frac{1}{2\pi \cdot R \cdot f_0} \sqrt{2 \frac{B - A \pm \sqrt{B^2 - 2AB}}{A^2(1 + 2A)}} \; ; \text{and}$$

$$\frac{1}{2\pi \cdot R \cdot f_0} \sqrt{\frac{1}{2(1 + 2A)} \frac{A^2}{B - A \pm \sqrt{B^2 - 2AB}}},$$

with: $A = \frac{R_0}{R}$ and $B = \frac{1 + 2R_0/R}{4Q^2}$, $R_0$ standing for a resistive output impedance of the second amplifier, R designating the resistance of the first and second resistors, Q and $f_0$, respectively, designating a quality factor and a natural frequency of the filter.

9. The filter of claim 8, wherein a resistive output impedance of the second amplifier complies with the following inequality:

$$R0 \le R\left(\frac{1}{8Q^2 - 2}\right).$$

10. A low-pass filter comprising:
a first resistor, a second resistor, and a first buffer connected in series between an input terminal and an output terminal;
a second buffer and a first capacitor connected in series with each other, the series connected second buffer and first capacitor connected between an input of the first buffer and an intermediate node between the series connected first and second resistors;
a second capacitor connected between an output of the first buffer and a reference voltage; and
a third capacitor connected between an input to the first buffer and the reference voltage.

11. The filter of claim 10, wherein the first buffer and the second buffer have a unity gain.

12. The filter of claim 10, wherein the first capacitor and the second capacitor have a capacitance ratio that is equal to a resistive output impedance ratio between the first buffer and the second buffer.

13. The filter of claim 10, wherein the first resistor and the second resistor have equal resistance values.

14. The filter of claim 13, wherein the first capacitor and the second capacitor have equal capacitance values.

15. A low-pass filter comprising:
an input terminal and an output terminal;
a first resistor, a second resistor, and a first buffer connected in series between the input terminal and the output terminal, wherein an output of the first buffer is connected to the output terminal through a first node, the second resistor is connected to the first resistor through a second node, and the second resistor is connected to an input of the first buffer through a third node;
a first capacitor connected between the first node and a reference voltage node;
a second capacitor connected between the third node and the reference voltage node; and
a second buffer and a third capacitor connected in series between the third node at the input of the first buffer and the second node.

16. The filter of claim 15, wherein the first buffer and the second buffer have a unity gain.

17. The filter of claim 15, wherein the capacitances of the first capacitor and the third capacitor have a first ratio equal to a second ratio of a resistive output impedance of the first buffer and a resistive output impedance of the second buffer.

18. The filter of claim 15, wherein the first and second resistors have equal values.

19. The filter of claim 18, wherein the first and third capacitors have equal capacitances.

20. The filter of claim 15, wherein resistive output impedances of the first buffer and the second buffer comply with the following inequality:

$$R0 \le R\left(\frac{1}{8Q^2 - 2}\right).$$

21. A circuit, comprising:
a first resistor coupled between an input node and an intermediate node;
a first amplifier having an input and having an output coupled to an output node
a second resistor coupled between the intermediate node and the input of the first amplifier;
a second amplifier having an input coupled to the input of the first amplifier;
a first capacitor coupled between the output of the second amplifier and the intermediate node;
a second capacitor coupled between the inputs of the first and second amplifiers and a reference node; and
a third capacitor coupled between the output node at the output of the first amplifier and the reference node.

* * * * *